United States Patent
Yu et al.

(10) Patent No.: US 11,908,678 B2
(45) Date of Patent: Feb. 20, 2024

(54) METHOD OF CMP INTEGRATION FOR IMPROVED OPTICAL UNIFORMITY IN ADVANCED LCOS BACK-PLANE

(71) Applicant: Applied Materials, Inc., Santa Clara, CA (US)

(72) Inventors: Lan Yu, Albany, NY (US); Benjamin D. Briggs, Clifton Park, NY (US); Tyler Sherwood, Fonda, NY (US); Raghav Sreenivasan, Fremont, CA (US); Joseph Salfelder, Pleasant Valley, NY (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/149,399

(22) Filed: Jan. 14, 2021

(65) Prior Publication Data
US 2022/0223402 A1     Jul. 14, 2022

(51) Int. Cl.
*H01L 21/02* (2006.01)
*H01L 21/4757* (2006.01)

(52) U.S. Cl.
CPC .. *H01L 21/02024* (2013.01); *H01L 21/02019* (2013.01); *H01L 21/47573* (2013.01)

(58) Field of Classification Search
CPC ......... H01L 21/02024; H01L 21/02019; H01L 21/47573
See application file for complete search history.

(56) References Cited

U.S. PATENT DOCUMENTS

| | | | |
|---|---|---|---|
| 5,170,407 A | * | 12/1992 | Schubert ............. H01S 5/18361 372/45.01 |
| 5,892,563 A | | 4/1999 | Ono et al. |
| 5,903,058 A | | 5/1999 | Akram |
| 6,008,876 A | | 12/1999 | Moore |
| 6,333,519 B1 | | 12/2001 | Nakazawa |
| 6,356,332 B1 | | 3/2002 | Ichikawa et al. |

(Continued)

FOREIGN PATENT DOCUMENTS

| | | |
|---|---|---|
| CN | 101398579 B | 6/2010 |
| CN | 101866083 B | 5/2012 |

(Continued)

OTHER PUBLICATIONS

International Search Report and Written Opinion dated Mar. 4, 2022 in International Patent Application No. PCT/US2021/059737, 8 pages.

(Continued)

*Primary Examiner* — Duy Vu N Deo
(74) *Attorney, Agent, or Firm* — Kilpatrick Townsend & Stockton LLP

(57) ABSTRACT

Processing methods may be performed to form a filled contact hole in a mirror layer of a semiconductor substrate. The method may include forming a contact hole through a mirror layer of the semiconductor substrate by an etch process. The method may include filling the contact hole with a fill material. A portion of the fill material may overlie the mirror layer. The method may also include removing a portion of the fill material external to the contact hole by chemical mechanical polishing landing on the mirror layer.

17 Claims, 7 Drawing Sheets

(56) References Cited

U.S. PATENT DOCUMENTS

| | | | |
|---|---|---|---|
| 6,435,942 B1* | 8/2002 | Jin | H01L 21/3212 257/E21.244 |
| 6,577,362 B1 | 6/2003 | Moore | |
| 6,795,144 B1 | 9/2004 | Okuda et al. | |
| 7,928,579 B2 | 4/2011 | Wark et al. | |
| 11,322,910 B2 | 5/2022 | Park et al. | |
| 11,573,452 B2 | 2/2023 | Yu et al. | |
| 11,586,067 B2 | 2/2023 | Yu et al. | |
| 2001/0045999 A1 | 11/2001 | Nakazawa et al. | |
| 2002/0126233 A1 | 9/2002 | Yamagishi et al. | |
| 2002/0175414 A1 | 11/2002 | Teh et al. | |
| 2004/0017537 A1 | 1/2004 | Magana et al. | |
| 2005/0134753 A1 | 6/2005 | Higuchi et al. | |
| 2007/0026557 A1* | 2/2007 | Yu | G02F 1/133553 438/34 |
| 2007/0026679 A1 | 2/2007 | Yu et al. | |
| 2007/0170430 A1 | 7/2007 | Nakagawa | |
| 2007/0175104 A1* | 8/2007 | Nishiyama | C09G 1/02 257/E21.244 |
| 2007/0262463 A1 | 11/2007 | Akram | |
| 2007/0284627 A1 | 12/2007 | Kimura | |
| 2007/0287211 A1 | 12/2007 | Wu | |
| 2011/0237009 A1* | 9/2011 | Huang | G02F 1/136277 257/E31.127 |
| 2012/0081645 A1 | 4/2012 | Yoshimura et al. | |
| 2013/0027651 A1 | 1/2013 | Meldrim | |
| 2015/0048514 A1 | 2/2015 | Tang et al. | |
| 2016/0111324 A1 | 4/2016 | Chiu et al. | |
| 2017/0075166 A1 | 3/2017 | Son et al. | |
| 2018/0190878 A1 | 7/2018 | Li et al. | |
| 2018/0337090 A1 | 11/2018 | Shen et al. | |
| 2018/0351035 A1 | 12/2018 | Chung et al. | |
| 2019/0164944 A1 | 5/2019 | Chae et al. | |
| 2020/0152691 A1 | 5/2020 | Lee | |
| 2022/0163707 A1* | 5/2022 | Yu | G02B 5/0808 |
| 2022/0163834 A1* | 5/2022 | Yu | G02F 1/13394 |
| 2022/0163845 A1* | 5/2022 | Yu | G02F 1/133553 |
| 2022/0163846 A1* | 5/2022 | Yu | G02F 1/133553 |
| 2022/0165912 A1* | 5/2022 | Yu | G02F 1/1368 |
| 2022/0223402 A1 | 7/2022 | Yu et al. | |
| 2022/0283452 A1 | 9/2022 | Nelson | |
| 2022/0285425 A1 | 9/2022 | Young et al. | |

FOREIGN PATENT DOCUMENTS

| | | |
|---|---|---|
| CN | 108845442 A | 11/2018 |
| JP | 2000-124313 A | 4/2000 |
| JP | 2007-193200 A | 8/2007 |
| JP | 2011-123093 A | 6/2011 |
| TW | 200415550 A | 8/2004 |
| TW | 200744127 A | 12/2007 |
| TW | 200834197 A | 8/2008 |
| TW | 200842400 A | 11/2008 |
| TW | 200916406 A | 4/2009 |
| TW | 201001009 A | 1/2010 |
| TW | 201218274 A | 5/2012 |
| TW | 202039719 A | 11/2020 |
| WO | 2020-008765 A1 | 1/2020 |

OTHER PUBLICATIONS

International Search Report and Written Opinion dated Mar. 8, 2022 in International Patent Application No. PCT/US2021/059744, 8 pages.

International Search Report and Written Opinion dated Mar. 15, 2022 in International Patent Application No. PCT/US2021/059756, 6 pages.

International Search Report and Written Opinion dated Mar. 15, 2022 in International Patent Application No. PCT/US2021/05975, 6 pages.

International Search Report and Written Opinion dated Apr. 29, 2022 in International Patent Application No. PCT/US2022/011847, 7 pages.

Application No. PCT/US2021/059737, International Preliminary Report on Patentability, dated Jun. 1, 2023, 6 pages.

Application No. PCT/US2021/059744, International Preliminary Report on Patentability, dated Jun. 1, 2023, 6 pages.

Application No. PCT/US2021/059752, International Preliminary Report on Patentability, dated Jun. 1, 2023, 5 pages.

Application No. PCT/US2021/059756, International Preliminary Report on Patentability, dated Jun. 1, 2023, 5 pages.

Application No. PCT/US2022/011847, International Preliminary Report on Patentability, dated Jul. 27, 2023, 6 pages.

* cited by examiner

FIG. 4B
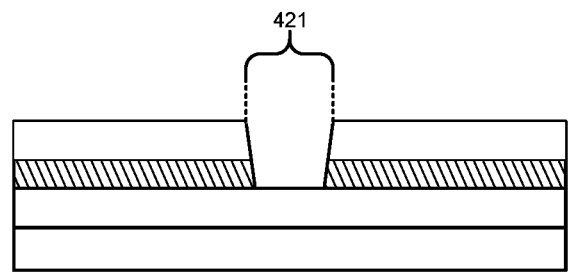
FIG. 4C

METHOD OF CMP INTEGRATION FOR IMPROVED OPTICAL UNIFORMITY IN ADVANCED LCOS BACK-PLANE

CROSS-REFERENCES TO RELATED APPLICATIONS

The present technology is related to the following applications, all concurrently filed Nov. 20, 2020, and titled: "STRUCTURE AND METHOD OF ADVANCED LCOS BACK-PLANE HAVING HIGHLY REFLECTIVE PIXEL VIA METALLIZATION" U.S. Patent Publication No. 2022/0165912, filed as U.S. patent application Ser. No. 17/100,402, "METHOD FOR LCOS DBR MULTLAYER STACK PROTECTION VIA SACRIFICIAL HARDMASK FOR RIE AND CMP PROCESSES" U.S. Patent Publication No. 2022/0163846, filed as U.S. patent application Ser. No. 17/100,422, "STRUCTURE AND METHOD OF MIRROR GROUNDING IN LCOS DEVICES" U.S. Patent Publication No. 2022/0163707, filed as U.S. patent application Ser. No. 17/100,416, "STRUCTURE AND METHOD OF BI-LAYER PIXEL ISOLATION IN ADVANCED LCOS BACK-PLANE" U.S. Patent Publication No. 2022/0163834, filed as U.S. patent application Ser. No. 17/100,400, and "STRUCTURE AND METHOD OF ADVANCED LCOS BACK-PLANE HAVING ROBUST PIXEL VIA METALLIZATION" U.S. Patent Publication No. 2022/0163845, filed as U.S. patent application Ser. No. 17/100,407. Each of these applications is hereby incorporated by reference in their entirety for all purposes.

TECHNICAL FIELD

The present technology relates to semiconductor systems, processes, and equipment. More specifically, the present technology relates to processes and systems for forming and etching material layers on a semiconductor substrate.

BACKGROUND

Advanced liquid crystal on silicon (LCoS) devices are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Multilayer LCoS structures, such as those incorporating distributed Bragg reflectors (DBRs), may incorporate layers of dielectric or conducting material formed in a series of fabrication operations. In some cases, electrical contacts may be formed as high aspect ratio structures connecting two or more conducting layers separated by dielectric material, such as a pixel material formed through the layers making up the DBR. To provide individually addressable pixels in a display application, the electrical contacts may be electrically isolated from a mirror layer underlying the DBR. Electrical isolation of the contacts may be implemented by forming the electrical contacts through a fill material, rather than through the mirror layer, by forming a contact hole through the mirror layer and filling the contact hole with the fill material. At least a portion of the fill material may overlie the mirror layer after deposition, which introduces non-uniformities in a surface receiving a first layer of the DBR. To provide a DBR with a uniform upper surface, the first layer of the DBR may accommodate the non-uniformities in the surface. Resultant variation in the thickness of the first layer of the DBR can significantly impair the optical performance of the DBR as a whole, such as the color fidelity of the LCoS backplane, and thus the suitability of the LCoS structure for application in display devices.

Thus, there is a need for improved systems and methods that can be used to produce high quality devices and structures. These and other needs are addressed by the present technology.

SUMMARY

Processing methods may be performed to form a filled contact hole in a mirror layer of a semiconductor substrate. The method may include forming a contact hole through a mirror layer of the semiconductor substrate by an etch process. The method may include filling the contact hole with a fill material. A portion of the fill material may overlie the mirror layer. The method may also include removing a portion of the fill material external to the contact hole by chemical mechanical polishing landing on the mirror layer.

In some embodiments, the method may further include forming an optical stack overlying the mirror layer and the fill material. The optical stack may form an interface with the mirror layer. The optical stack may be or include a distributed Bragg reflector (DBR). The DBR may be or include a first layer characterized by a variation in a thickness of the first layer less than or about 30%. The chemical mechanical polishing may produce an upper surface of the mirror layer substantially free of the fill material. The chemical mechanical polishing may be characterized by a planarization length less than 5 mm. The chemical mechanical polishing may uses a down force exceeding or about 0.1 PSI, a rotation rate exceeding or about 10 RPM, and a slurry flow rate exceeding or about 50 mL/min. The chemical mechanical polishing may use a slurry. The slurry may include primary colloidal silica particles suspended in a solvent. The solvent may be or include de-ionized water and an acid. The particles may be characterized by an average diameter less than or about 1000 nm. The chemical mechanical polishing may use an acid dissolved in the solvent. The acid may be or include formic acid, acetic acid, butyric acid, oxalic acid, lactic acid, and/or citric acid.

The present technology also encompasses processing methods that may be performed to form a filled contact hole in a mirror layer of a semiconductor substrate. The method may include forming a contact hole through a mirror layer of the semiconductor substrate by an etch process. The method may include filling the contact hole with a fill material. A portion of the fill material may extend over the mirror layer. The method may include removing a portion of the fill material external to the contact hole by a removal process selective to the fill material. The method may also include polishing an upper surface of the mirror layer to a surface roughness less than or about 5 nm.

In some embodiments, the method may further include forming an optical stack overlying the mirror layer and the filled contact hole. The optical stack may form an interface with the mirror layer. The optical stack is characterized by a reflectance exceeding 95% across a wavelength range of 450 nm-650 nm. Polishing the upper surface of the mirror layer may include chemical mechanical polishing characterized by a planarization length less than 5 mm. The chemical mechanical polishing may use a down force exceeding or about 0.1 PSI, a rotation rate exceeding or about 10 RPM, and a slurry flow rate exceeding or about 50 mL/min. The chemical mechanical polishing may use a slurry. The slurry may include colloidal silica particles suspended in a solvent. The solvent may be or include de-ionized water and an acid. The particles may be characterized by an average diameter less than or about 1000 nm. The chemical mechanical polishing may use an acid dissolved in the solvent. The acid may be or include formic acid, acetic acid, butyric acid, oxalic acid, lactic acid, and/or citric acid.

The present technology also encompasses semiconductor structures including a semiconductor substrate. The structures may include a metal layer overlying the semiconductor substrate. The structures may include a spacer layer overlying the metal layer. The structures may include a mirror layer overlying the spacer layer. The structures may include an optical stack overlying the mirror layer. The structures may include a fill material filling a contact hole formed in the mirror layer. The fill material may be substantially level with an upper surface of the mirror layer. The upper surface of the mirror layer may be characterized by an average roughness less than or about 5 nm.

In some embodiments, the semiconductor structure may further include a distributed Bragg reflector (DBR). The DBR may include a first layer characterized by a variation in a thickness of the first layer less than or about 30%. The DBR may be characterized by a reflectance exceeding 95% across a wavelength range of 450 nm-650 nm. The DBR may form an interface with the mirror layer. The interface may be substantially free of the fill material. The contact hole may extends to the metal layer. The fill material may contact the metal layer.

Such technology may provide numerous benefits over conventional systems and techniques. For example, embodiments of the present technology may exhibit improved uniformity and control of optical stack dimensions during and after fabrication of LCoS structures. Such improvements may result in concurrent improvements in reflectivity of the optical stack and resulting optical performance of devices incorporating the LCoS structures. These and other embodiments, along with many of their advantages and features, are described in more detail in conjunction with the below description and attached figures.

BRIEF DESCRIPTION OF THE DRAWINGS

FIGS. 4A-4F illustrate schematic cross-sectional views of substrate materials on which selected operations are being performed according to some embodiments of the present technology.

Figure 1:
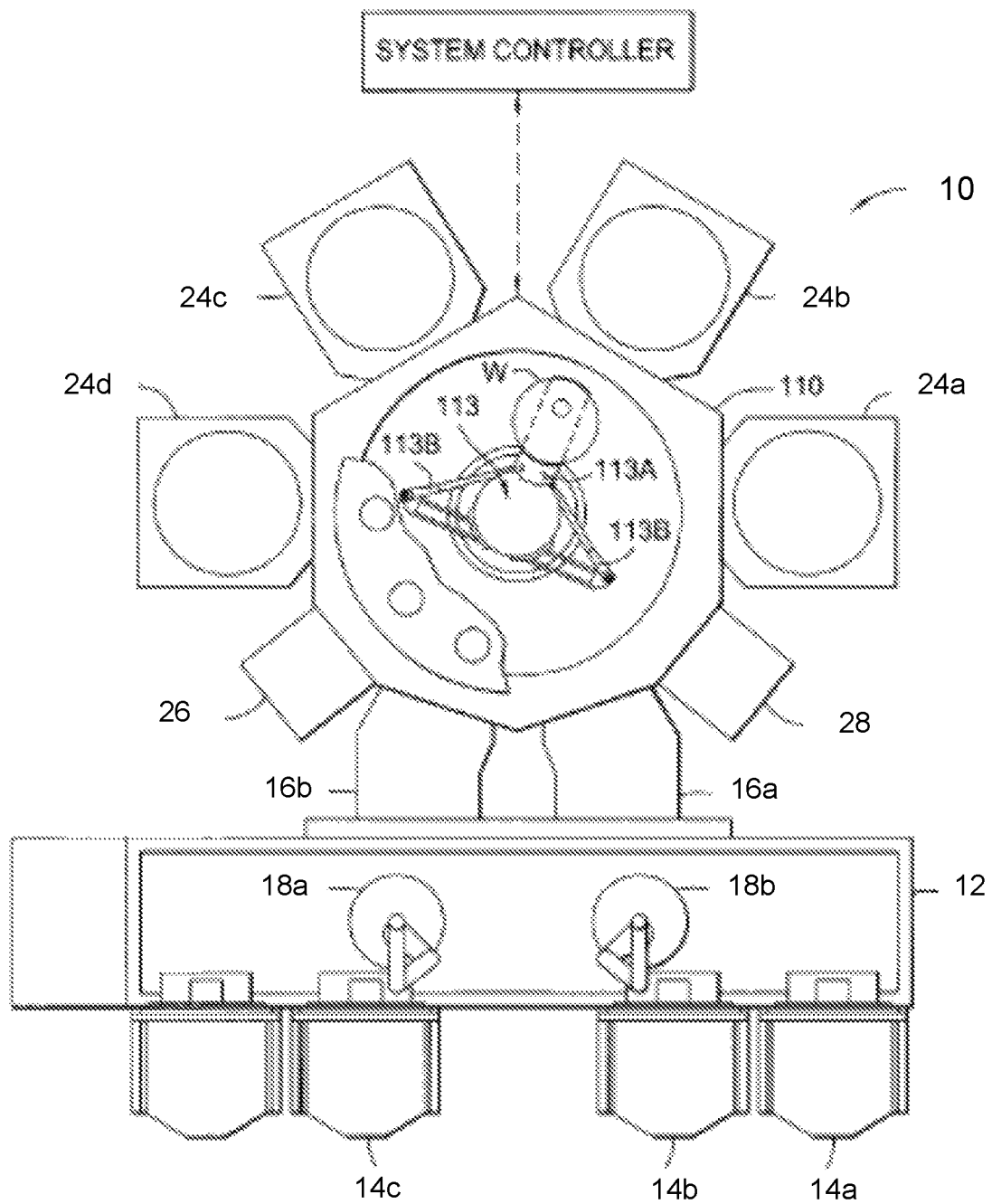
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of liquid crystal on silicon (LCoS) back-plane devices. Semiconductor structures built with an embedded optical stack, such as a distributed Bragg reflector (DBR), can have dramatically enhanced optical performance for increased display brightness and lower power consumption relative to other reflective back-plane structures for liquid crystal displays. In an LCoS pixel structure, an optical stack, such as an embedded DBR, may be interposed between a metal layer and a liquid crystal layer, where the electrical potential for actuating the liquid crystal layer may be provided by the metal layer. For example, a pixel material may be formed through the DBR to provide an electrical contact between the metal layer and the liquid crystal layer, as when a transparent conducting film overlies the DBR.

Incorporating the optical stack in the LCoS back-plane can add complexity to fabrication processes, as when incorporating layers of dielectric or conducting material formed in a series of fabrication operations. In some cases, electrical contacts may be formed as high aspect ratio structures connecting two or more conducting layers separated by dielectric material, such as a pixel material formed through the layers making up the DBR. To provide individually addressable pixels in a display, as an example application, the electrical contacts may be electrically isolated from a conductive mirror layer underlying the DBR. Electrical isolation of the contacts may be implemented by forming the electrical contacts through an insulating oxide material, rather than through the mirror layer. At least a portion of the insulating oxide material may overlie the mirror layer after deposition. Techniques for removing the overlying portion may be limited by low selectivity to the oxide material relative to the conductive material. For example, chemical mechanical polishing (CMP) may remove a portion of the mirror layer or may leave an interfacial layer of oxide material overlying the mirror layer, which introduces non-uniformities in the surface receiving a first layer of the DBR. To provide a DBR with a uniform upper surface, the first layer of the DBR may accommodate the non-uniformities introduced by the insulating oxide material. Resultant variation in the thickness of the first layer of the DBR can significantly impair the optical performance of the DBR as a whole, and thus the suitability of the LCoS structure for application in display devices, which in turn may negatively impact the optical performance of the optical stack.

The reflectivity of a DBR, for example, may depend to a significant degree on the thicknesses of the constituent layers making up the DBR. Variation in layer thicknesses on a scale of an individual pixel, on a scale of a device, or on a scale of a semiconductor wafer, may affect the reflectivity of the DBR across a target wavelength range and thus the overall optical performance of the LCoS device. For at least this reason, operations for forming the pixel material may introduce uniformity issues in LCoS back-plane structures, and may negatively impact the optical performance of optical stacks.

The present technology overcomes such limitations through an improved fabrication method, as described below. In some embodiments, the methods include etching a contact hole through the mirror layer to reveal an underlying metal layer. A fill material, such as an insulating material, may be deposited to fill the contact hole. A portion of the fill material deposited overlying the mirror layer may be removed by a CMP process that is selective to the fill material, relative to the mirror layer. In this way, CMP for removal of excess fill material may land on the mirror layer without leaving an interfacial layer of the fill material. In this way, subsequent operations for forming the DBR may benefit from a true reference point that provides a substantially uniform thickness for a first layer of the DBR over a scale of the pixel, over a scale of a device, or over a scale of a semiconductor wafer. Such uniformity may impart significantly improved optical performance in LCoS structures incorporating DBRs. For example, maintaining the thickness of the first layer of the DBR limits blue shifting or red shifting of the reflectivity spectrum of the DBR. In light of the sensitivity of display applications to color reproduction fidelity, wavelength variation in reflectivity of backplane structures impacts the suitability of such structures. In this way, limiting wavelength variation through improved CMP processes represent a significant improvement, permitting incorporation of LCoS back-plane structures in display devices.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
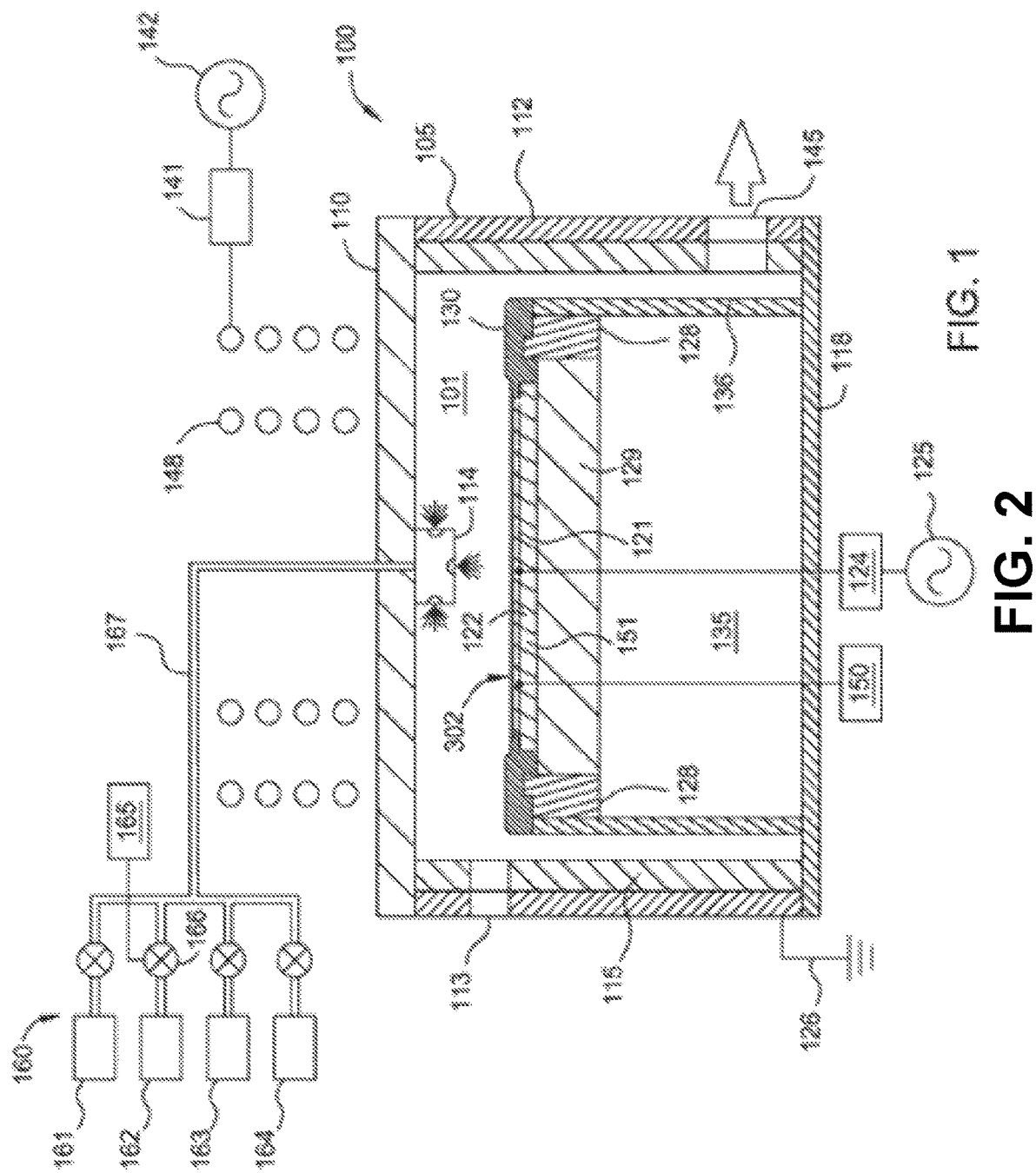
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, tetrafluoromethane, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
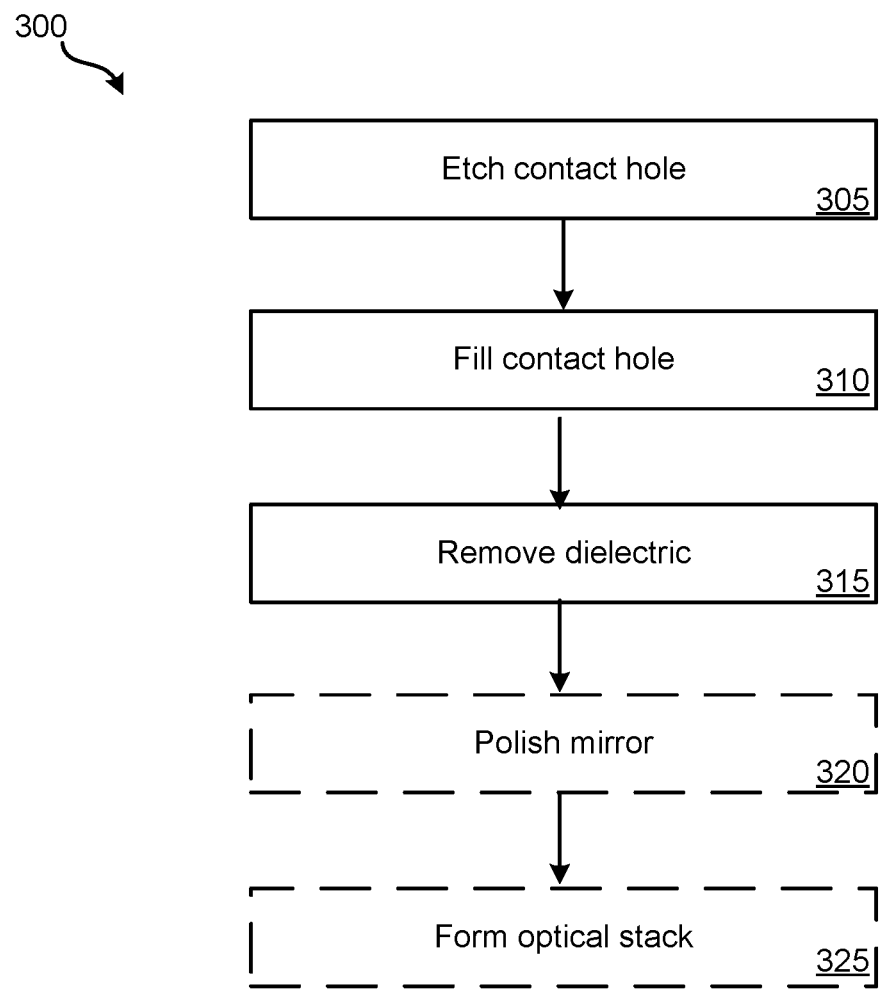
FIG. 3 shows selected operations in a method of forming a filled contact hole in a mirror layer of a semiconductor substrate according to some embodiments of the present technology.

FIG. 3 shows selected operations in a method 300 of forming a filled contact hole in a mirror layer of a semiconductor substrate according to some embodiments of the present technology. Many operations of method 300 may be performed, for example, in the chamber 100 as previously described. Method 300 may include one or more operations prior to the initiation of the method, including front end processing, deposition, etching, polishing, cleaning, or any other operations that may be performed prior to the described operations. The method may include optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4F, the illustrations of which will be described in conjunction with the operations of method 300. It is to be understood that FIG. 4 illustrates only partial schematic views, and a substrate may contain any number of semiconductor sections having aspects as illustrated in the figures, as well as alternative structural aspects that may still benefit from aspects of the present technology. Method 300 may involve optional operations to develop the semiconductor structures to a particular fabrication operation.

Figure 4A:
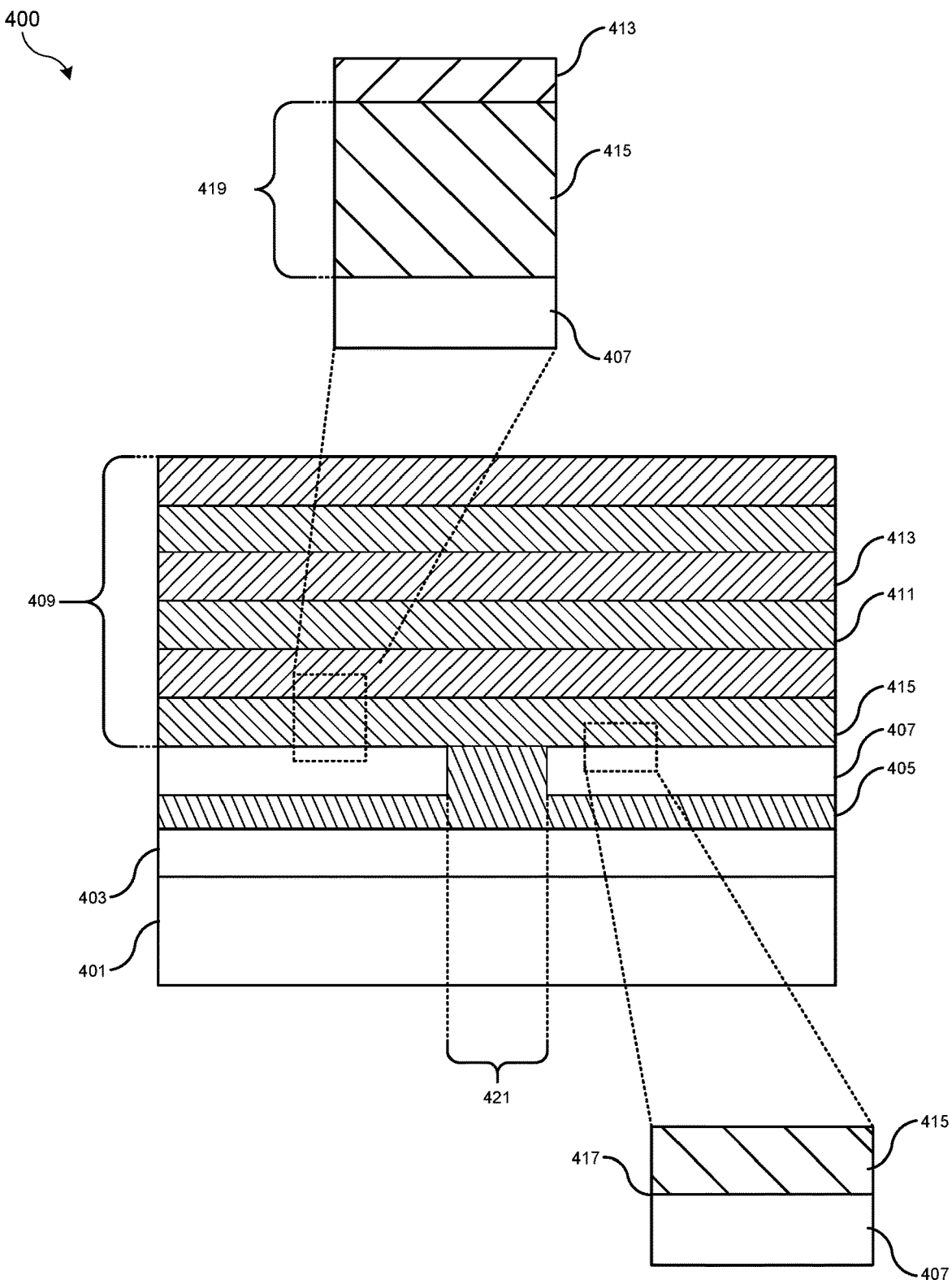

In the context of method 300, the semiconductor structure 400 may define a preliminary structure from which an active pixel may be formed, described in reference to FIG. 4A. At one or more points in the formation processes leading to the semiconductor structure 400, the operations of method 300 may be implemented to form a filled contact hole through constituent layers of the semiconductor structure 400, as described in reference to FIGS. 4B-4F. A resulting display device, formed by a process including the operations of method 300, may incorporate a semiconductor structure 400 having an optical stack characterized by substantially uniform thickness across multiple length-scales, and may therefore exhibit improved optical performance, such as limited wavelength variability of reflectance properties and limited variation of reflection efficiency across a structure scale, a device scale, or a wafer scale.

As illustrated in FIG. 4A, the semiconductor structure 400 may represent a liquid crystal on silicon (LCoS) back-plane including one or more constituent structures forming an active pixel. As illustrated, structure 400 may include a substrate 401 made of or containing silicon or some other semiconductor substrate material, on which the one or more structures of the LCoS back-plane may be formed. For example, structure 400 may include a metal layer 403, formed, for example, from copper or another metal compatible with semiconductor processing techniques. Structure 400 may further include a reflective and conductive mirror layer 407 that may be or include aluminum, copper, or another reflective material suitable for providing a mirror surface. To electrically insulate the mirror layer 407 from the metal layer 403, a spacer layer 405 may be formed overlying the metal layer 403 prior to forming the mirror layer 407. The structure may include an optical stack providing a reflective backing structure. As illustrated, the optical stack can be or include a distributed Bragg reflector 409 (DBR), which may be formed overlying the mirror layer 407. In some embodiments, the optical stack may include other reflective layers or structures, including, but not limited to dielectric mirrors or other high-reflection coatings, In some embodiments, the DBR 409 may include multiple alternating layers of high-k and low-k dielectric materials. For example, low-k layers 411 may be or include a low-k dielectric material, such as silicon oxide or organosilicate glass. By contrast, high-k layers 413 may be or include a high-k dielectric material, such as tantalum oxide.

In some embodiments, a first layer 415 of the DBR 409, which may be a low-k layer 411, may be formed overlying the mirror layer 407 such that it forms an interface 417 with the mirror layer 407. The interface 417 between the mirror layer 407 and the first layer 415 of the DBR 409 may be characterized by substantially direct contact between the mirror layer 407 and the first layer 415 of the DBR 409, and the effective absence of interstitial material between the two layers. In FIG. 4A, the interface 417 is illustrated in an inset. In some cases, the interface 417 may be substantially free of any oxide material, such as spacer material 405 or fill material, described below.

The mirror layer 407 may be formed overlying the spacer layer 405 as part of fabrication operations for preparing a semiconductor substrate. The fabrication operations may be implemented uniformly across the scale of a semiconductor wafer, which subsequently may be divided into multiple instances of the structure 400 by further fabrication operations. In this way, the mirror layer 407 may be formed by material deposition processes including, but not limited to, sputtering, e-beam deposition, epitaxial techniques, or physical vapor deposition. Such techniques may be used to deposit conductive films onto the spacer layer 405, from which the mirror layer 407 may be formed by processes such as planarization and polishing. By forming the mirror layer 407 on a wafer scale, the surface may be substantially uniform across the scale of the structure 400, the scale of a device incorporating multiple instances of the structure 400, or on the scale of the wafer covering multiple device scales.

The uniformity of the mirror layer 407 may provide a wafer-scale reference for subsequent deposition techniques. In some embodiments, deposition of overlying structures, such as the first layer 415 of the DBR 409, may be controlled in reference to a deposition rate and a deposition time, taking the mirror layer 407 as a reference point from which to calculate the starting location for building the DBR 409. For example, processes such as plasma-enhanced chemical vapor deposition may deposit low-k material or high-k material substantially uniformly across a wafer at deposition rates that can be parametrically controlled by manipulating process parameters of the chamber 100. The DBR 409 may, therefore, incorporate multiple layers of precise thickness imparting desired reflectivity behavior. That being said, a thickness 419 of the first layer 415 of the DBR 409 may depend, in addition to deposition process parameters, on the presence of material overlying the mirror layer 407. Where the interface 417 includes an interstitial layer, substantially absent from the structure 400, any variation in the thickness of the interstitial layer will introduce corresponding variation in the thickness 419 of the first layer 415 of the DBR 409. In turn, variation in the thickness 419 of the first layer 415 of the DBR 409 may significantly impact the reflectivity of the DBR 409.

In some embodiments, variation in the thickness 419 of the first layer 415 of the DBR 409 may shift the reflectivity spectrum of the DBR 409 in terms of reflectivity as a function of wavelength of incident light. In an illustrative example, the high-k layers 413 may be or include tantalum oxide and the low-k layers 411, including the first layer 415, may be or include silicon oxide. In this example, a decrease in the thickness 419 of the first layer 415 of greater than or about 5%, greater than or about 10%, greater than or about 15%, greater than or about 20%, greater than or about 25%, greater than or about 30%, or more, may result in a pronounced blue shift of the wavelength-dependent reflectivity of the overall DBR 409. By contrast, an increase in the thickness 419 of the first layer 415 of similar extent may result in a pronounced red shift of the wavelength-dependent reflectivity of overall DBR 409. The shift may exceed about 5 nm, about 10 nm, about 20 nm, about 25 nm, about 30 nm, or more in the red or blue direction, depending on the variation, and may result in significant variability in reflectivity properties, such as reflection efficiency, across the scale of a device incorporating multiple instances of the structure 400. The variation in the thickness 419 of the first layer 415 alone can elicit the resulting impact on reflection efficiency affecting the entire DBR 409, thereby demonstrating the significant improvement on device performance that may be imparted by forming the interface 417 between the first layer 415 of the DBR 409 and the mirror layer 407, substantially free of interstitial material.

In some embodiments, the mirror layer 407 may be physically separated from active electrical components of the structure 400 by the spacer layer 405 to prevent a short-circuit from affecting multiple pixels, as when the mirror layer 407 spans multiple pixels on the LCoS device. For example, in structure 400, the mirror layer 407 may be electrically isolated from the metal layer 403 by the spacer layer 405, where the spacer layer 405 can be or include a dielectric oxide material. To further isolate the mirror layer 407 from electrical contacts formed to connect the metal layer 403 to overlying conductive layers, as part of subsequent operations making up the LCoS fabrication process, the structure 400 may include a contact hole 421 in the mirror layer 407. The contact hole 421 may be filled with an insulating or dielectric material, as described in more detail in reference to FIGS. 4B-4F, below. In this way, a conducting structure, such as a metallic pixel structure, may be formed through the contact hole 421 to provide a conductive contact with the metal layer 403 for actuating a liquid crystal layer overlying the structure 400. To facilitate the formation and filling of the contact hole 421 the operations of the method 300 may implement improved formation and removal processes such that a removal process may land on the mirror layer 407. Furthermore, the operations of method 300 may also provide for the interface 417 to be substantially free of the fill material, and for the first layer 415 of the DBR 409 to have a substantially uniform thickness 419, at least across the scale of the structure 400, an LCoS device, or a semiconductor wafer.

At operation 305, the contact hole 421 may be etched through the mirror layer 407 and the spacer layer 405, as illustrated in FIGS. 4B-4C. Etching the contact hole 421 may include a dry etch process, wherein a patterned removal of material may be effected, for example, by one or more intermediate operations including, but not limited to, masking, lithography, and mask removal. In some embodiments, forming the contact hole 421 may include additional processes including, but not limited to, depositing a patterned etch mask including a window through which the etch process of operation 305 may form the contact hole 421. For example, the etch mask may be or include a material resistant to acid etching. Subsequent formation of the contact hole 421, the etch mask may be removed by etch techniques selective to the etch mask over the mirror layer 405. In some embodiments, operation 305 may be applied on a wafer-scale. For example, multiple instances of the contact hole 421 may be etched by a wafer-scale etch process.

In some cases, the contact hole 421, as illustrated in FIG. 4C, may extend to the metal layer 403, such that the metal layer 403 forms a floor of the contact hole 421. That being said, the contact hole 421 may extend only a partially into the spacer layer 405, for example, when the dry etch process may potentially remove material of the metal layer 403 as well as the mirror layer 407 and the spacer layer 405. In this way, the metal layer 403 may be protected while forming the contact hole 421. In some embodiments, subsequent operations may include etching a via through the contact hole 421 to reveal the metal layer 403. In such cases, removing only a portion of the spacer layer 405 in the contact hole 421 may have a negligible impact on the overall performance of the structure 400.

Figure 4D:
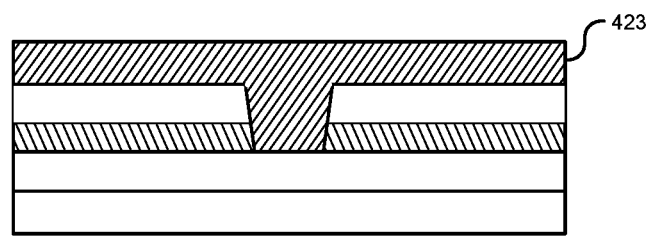

Subsequent forming the contact hole 421, a fill material 423 may be deposited to fill the contact hole 421 at operation 310, as illustrated in FIG. 4D. The Operation 310 may include filling the contact hole 421 by depositing the fill material 423 by one or more processes including, but not limited to, chemical vapor deposition, atomic layer deposition, physical vapor deposition, or other techniques compatible with semiconductor fabrication. The fill material 423 may be deposited by a wafer-scale process and, as such, may include a portion overlying the mirror layer 407. In some embodiments, the fill material 423 may be or include a dielectric material. In some embodiments, the fill material 423 may be or include the same material as that forming the spacer layer 405. In some embodiments, the fill material 423 may be or include silicon oxide or other dielectric materials compatible with semiconductor fabrication processes. As described in reference to FIG. 4A, the fill material 423 may be formed to fill the contact hole 421, but may do so without contacting the metal layer 403, due to residual material of the spacer layer 405 remaining after operation 305. In contrast, the fill material 423 may contact the metal layer 403 in some embodiments, as when the contact hole 421 is etched such that the metal layer 403 is revealed.

Figure 4E:
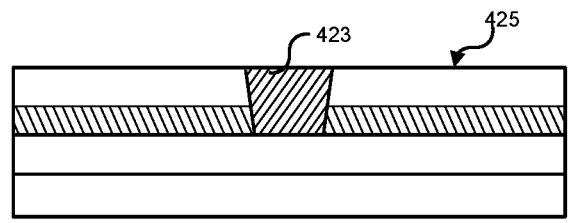

Subsequent filling the contact hole 421, a portion of the fill material 423 may be removed at operation 315, as illustrated in FIG. 4E. In some embodiments, the removal may include CMP removal of a portion of the fill material 423 overlying the mirror layer 407. In some embodiments, operation 315 may include removing the fill material 423 external to the contact hole 421 and leaving an upper surface 425 of the mirror layer 407 substantially free of the fill material 423. CMP may be selective to the fill material 423. In this way, the CMP process may uniformly remove the fill material 423 until reaching the upper surface 425 of the mirror layer 407, at which point the removal rate of the CMP process may decrease significantly, and thus may serve as an endpoint for the removal process and may permit the CMP to land on the mirror layer 407. As such, the CMP process may selectively remove the portion of the fill material 423 overlying the sacrificial mirror layer 407.

The CMP process may form a substantially level surface between the fill material and the upper surface 425 of the mirror layer 407. Providing a substantially level surface between the fill material 423 and the mirror layer 403 may limit the formation of voids between the fill material 423 and overlying dielectric layers. Limiting the formation of voids in the contact hole 421 may, in turn, facilitate uniform deposition of the first layer 415 of the DBR 409 and attendant improvement in optical performance of the structure 400.

The CMP processes employed as part of operation 315 may implement parameters or characteristics that impart the selectivity to the fill material 423 and permit the CMP process to land on the mirror layer 407. For example, the CMP processes may include using a slurry that is prepared to include colloidal silica powder, DI water and additives such as a hydrophilic additive, a polymeric dispersing agent and a weak acid or base. Additionally or alternatively, the slurry may include aluminum, cerium, or silica particles. It may be understood that the size of the slurry particles may influence the roughness of the polished surface, and as such, both the size and the distribution of the particles may influence the efficacy of CMP processes. For example, where particles are too large, the surface may be scratched or otherwise spoiled, where the particles may become embedded in the surface. In contrast, particles that are relatively small may remove material from the polished surface too slowly or not at all. Furthermore, where the particle size distribution is broad, the CMP process may be both relatively ineffective and damaging. As such, in some embodiments, the particles may be characterized by an average diameter less than or about 1 μm, less than or about 900 nm, less than or about 800 nm, less than or about 700 nm, less than or about 600 nm, less than or about 500 nm, less than or about 400 nm, less than or about 300 nm, less than or about 200 nm, less than or about 100 nm, less than or about 50 nm.

In some embodiments, the CMP process may use an acid solution dissolved in the solvent to stabilize the slurry dispersion. The acid solution may be or include a weak acid, an organic acid, and/or a weak base, to buffer and/or mediate the pH of the slurry. For example, the acid solution may be or include formic acid, acetic acid, butyric acid, oxalic acid, lactic acid and/or citric acid. In some embodiments, the CMP process may implement operating parameters within an operating window, such a down force, a rotation rate, or a slurry flow rate. For example, CMP processes may provide relatively better results above a minimum down force, where the down force describes the pressure applied by the polishing pad onto the surface to be polished. Below a certain down force, the CMP process may be ineffective or may polish slowly, and may negatively impact the performance polishing. In this way, the down force may be greater than or about 0.05 PSI, greater than or about 0.1 PSI, greater than or about 0.15 PSI, greater than or about 0.2 PSI, greater than or about 0.25 PSI, greater than or about 0.3 PSI, greater than or about 0.35 PSI, greater than or about 0.45 PSI, greater than or about 0.5 PSI, greater than or about 0.55 PSI, greater than or about 0.6 PSI, greater than or about 0.65 PSI, greater than or about 0.7 PSI, greater than or about 0.75 PSI, greater than or about 0.8 PSI, greater than or about 0.85 PSI, greater than or about 0.9 PSI, greater than or about 0.95 PSI, greater than or about 1.0 PSI, or greater.

Similarly, a rotation rate may exhibit an optimum and/or minimum operational range for which the CMP process provides improved results. Below a certain rotation rate, viscosity effects, removal rates, or other phenomena, may limit the efficacy of CMP processes. In this way, the rotation rate may be greater than or about 1, greater than or about 5 RPM, greater than or about 10 RPM, greater than or about 15 RPM, greater than or about 20 RPM, greater than or about 25 RPM, greater than or about 30 RPM, greater than or about 35 RPM, greater than or about 40 RPM, greater than or about 45 RPM, greater than or about 50 RPM, or greater.

Similarly, a slurry flow rate, which describes a volumetric flow rate of slurry introduced into the gap between the CMP polishing pad and the polished surface, may be characterized by an optimum and/or minim value. For example, below a certain value, the polishing pad may seize to the polished surface, may heat and deform the surface, or may chemically alter the surface as a result of accumulation of byproducts in the gap. As such, the slurry flow rate may be may be greater than or about 1 mL/min, greater than or about 10 mL/min, greater than or about 20 mL/min, greater than or about 30 mL/min, greater than or about 40 mL/min, greater than or about 50 mL/min, greater than or about 60 mL/min, greater than or about 70 mL/min, greater than or about 80 mL/min, greater than or about 90 mL/min, greater than or about 100 mL/min, greater than or about 110 mL/min, greater than or about 120 mL/min, greater than or about 130 mL/min, greater than or about 140 mL/min, greater than or about 150 mL/min, greater than or about 160 mL/min, greater than or about 170 mL/min, greater than or about 180 mL/min, greater than or about 190 mL/min, greater than or about 200 mL/min, or greater.

In some embodiments, the method 300 may include additional optional operations. For example, the method 300 may include operation 320. In some embodiments, operation 320 may include polishing the upper surface 425 of the mirror layer 407. The polishing of the mirror layer 407 may be implemented by a second CMP process characterized by a different set of operating parameters than the first CMP process described in reference to operation 315. Polishing the mirror layer 407 may provide improved control of deposition conditions, such as surface uniformity, such that the first layer 415 of the DBR 409 may be deposited directly onto the mirror layer 407. In some embodiments, the CMP processes employed as part of operation 320 may implement parameters or characteristics for polishing the upper surface 325 of the mirror layer 407 to an average surface roughness less than or about 20 nm, less than or about 19 nm, less than or about 18 nm, less than or about 17 nm, less than or about 16 nm, less than or about 15 nm, less than or about 14 nm, less than or about 13 nm, less than or about 12 nm, less than or about 11 nm, less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, less than or about 0.5 nm, less than or about 0.1 nm, or less. For example, the CMP processes may include using a slurry including particles suspended in a solvent. The particles may be or include aluminum, aluminum oxide, cerium oxide, silicon oxide, or other ceramic or oxide particles, such as primary colloidal silica particles. The size of the particles may influence the effectiveness of the CMP process, for example, by affecting the roughness of the polished surface, the rate of material removal, and the extent of particle embedding into the polished surface. Above a certain size, particles may produce a surface that is excessively rough, or may contaminate the surface. In contrast, below a certain value, the rate of removal may be too low for CMP processing to be practicable. In this way, the particles may be characterized by an average diameter greater than or about 50 nm, greater than or about 100 nm, greater than or about 150 nm, greater than or about 200 nm, greater than or about 250 nm, greater than or about 300 nm, greater than or about 350 nm, greater than or about 400 nm, greater than or about 450 nm, greater than or about 500 nm, greater than or about 550 nm, greater than or about 600 nm, greater than or about 650 nm, greater than or about 700 nm, greater than or about 750 nm, greater than or about 800 nm, greater than or about 850 nm, greater than or about 900 nm, greater than or about 950 nm, greater than or about 1000 nm, or greater.

In some embodiments, the CMP process may use an acid solution dissolved in the solvent. Inclusion of an acid in a CMP slurry may serve to stabilize the suspension, for example, by maintaining or buffering the pH of the slurry, which may stabilize surface charges of particles suspended in the slurry and prevent agglomeration. In this way, the acid solution may be or include formic acid, acetic acid, butyric acid, oxalic acid, lactic acid, or citric acid dissolved in the solvent.

In the context of the structure 400, planarization length describes a characteristic lateral distance on the upper surface 425 of the mirror layer 407 under which the pad employed to perform the removal or polishing operation will conform to surface features, whereas above which the pad will bridge across nanotopography and preferentially thin raised features on the upper surface 425. Planarization length may depend on tool configuration, such as a stiffness of a polishing pad used for the CMP process, or other factors. In some cases, characterization of the planarization length, compared to surface topography, may facilitate the CMP process to land on the mirror layer 407 and provide a substantially uniform upper surface 425 of the mirror layer 407. In some embodiments, the CMP processes of operation 315 or 320 may serve to planarize the mirror layer 407. For example, the CMP process may be characterized by a planarization length less than or about 10 mm, less than or about 9 mm, less than or about 8 mm, less than or about 7 mm, less than or about 6 mm, less than or about 5 mm, less than or about 4 mm, less than or about 3 mm, less than or about 2 mm, less than or about 1 mm, less than or about 0.5 mm, less than or about 0.1 mm, or less.

Polishing the mirror layer 407 subsequent filling contact hole 421 may provide improved optical performance of the mirror layer 407. For example, the CMP process described in reference to operation 315, while selective to the fill material 423, may leave scratches, embedded slurry particles, or other roughness in the upper surface 425 of the mirror layer 407. Prior to polishing, therefore, the reflectivity of the mirror layer 407 may be reduced relative to either a polished mirror layer or an as-deposited mirror layer. In this way, polishing, subsequent removing the fill material 423 from the upper surface 425 of the mirror layer 407, may improve the reflectivity of the mirror layer and the overall optical performance of the structure 400.

Figure 4F:
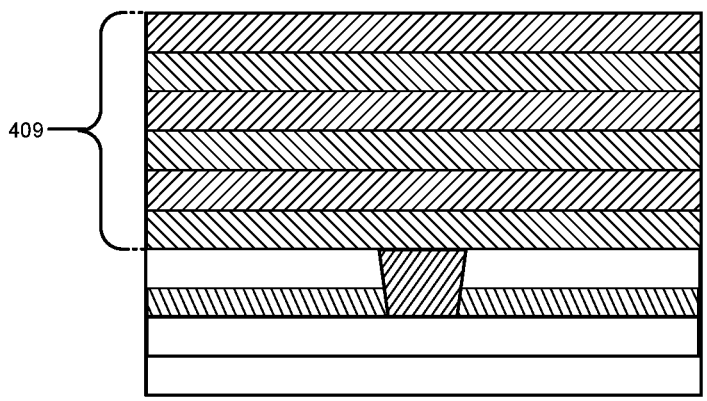

In some embodiments, the method 300 may include additional optional operations. For example, the method 300 may include operation 325. In some embodiments, operation 325 may include forming an optical stack overlying the mirror layer 407 and the fill material 423, as illustrated in FIG. 4F. The optical stack may be or include the DBR 409, which, as described above, may include multiple layers of high-k material and low-k material. The first layer 415 of the DBR 409 may be a low-k layer 411, and, may be formed by deposition processes compatible with low-k materials. For example, the low-k layer 411 may be or include silicon oxide or organo-silicate glass. As such, the processes employed to form the first layer 415 of the DBR 409 may include, but are not limited to, plasma enhanced chemical vapor deposition, chemical vapor deposition, atomic layer deposition, or physical vapor deposition. By implementing the operations of the method 300, the formation of the first layer 415 of the DBR may be implemented using the upper surface 425 of the mirror layer 407 as a reference point to estimate or measure the thickness 419 of the first layer 415. By providing the interface 417 substantially free of the fill material 423, for example, the thickness 419 of the first layer 415 may be controlled with improved precision and uniformity on the scale of the structure 400, on the scale of a device incorporating multiple instances of the structure 400, or on the scale of a semiconductor wafer encompassing many instances of the device scale. In turn, the improved uniformity of the first layer 415 of the DBR 409 may impart improved optical performance to the DBR 409 as a whole, for example, in terms of wavelength-dependent reflectivity. In some embodiments, the thickness 419 of the first layer 415 may exhibit variation less than or about 30%, less than or about 25%, less than or about 20%, less than or about 15%, less than or about 10%, less than or about 5%, or less, where the variation is expressed as a percentage of the maximum value of the thickness 419 of the first layer 415 of the DBR 409. Furthermore, the variation may be observed over the scale of the structure 400, the scale of a device 400, or the scale of a semiconductor wafer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of forming a filled contact hole in a mirror layer of a semiconductor substrate, the method comprising:
    forming a contact hole through a mirror layer of the semiconductor substrate by an etch process;
    filling the contact hole with a fill material, wherein a portion of the fill material overlies the mirror layer and the mirror layer is electrically isolated from a metal layer below the mirror layer;
    removing a portion of the fill material external to the contact hole by chemical mechanical polishing landing on the mirror layer; and
    forming an optical stack overlying the mirror layer and the fill material, wherein the optical stack comprises a distributed Bragg reflector (DBR) that forms an interface with the mirror layer and the fill material, and the DBR is characterized by a reflectance exceeding 95% across a wavelength range of 450 nm-650 nm.

2. The method of claim 1,
    wherein the interface of the DBR with the mirror layer is substantially free of the fill material.

3. The method of claim 1, wherein the DBR comprises a first layer characterized by a variation in a thickness of the first layer less than or about 30%.

4. The method of claim 1, wherein the chemical mechanical polishing produces an upper surface of the mirror layer substantially free of the fill material, the chemical mechanical polishing being characterized by a planarization length less than or about 5 mm.

5. The method of claim 1, wherein the chemical mechanical polishing uses a down force exceeding or about 0.1 PSI, a rotation rate exceeding or about 15 RPM, and a slurry flow rate exceeding or about 50 mL/min.

6. The method of claim 1, wherein the chemical mechanical polishing uses a slurry comprising silica particles suspended in a solvent comprising de-ionized water, the particles characterized by an average diameter less than or about 1 μm.

7. The method of claim 6, wherein the chemical mechanical polishing uses an acid dissolved in the solvent.

8. A method of forming a filled contact hole on a mirror layer of a semiconductor substrate, the method comprising:
    forming a contact hole through a mirror layer of the semiconductor substrate by an etch process;
    filling the contact hole with a fill material, wherein a portion of the fill material extends over the mirror layer and the mirror layer is electrically isolated from a metal layer below the mirror layer;
    removing a portion of the fill material external to the contact hole by a removal process selective to the fill material;
    polishing an upper surface of the mirror layer to a surface roughness less than 10 nm; and
    forming an optical stack overlying the mirror layer and the fill material, wherein the optical stack comprises a distributed Bragg reflector (DBR) that forms an interface with the mirror layer and the fill material, and the DBR is characterized by a reflectance exceeding 95% across a wavelength range of 450 nm-650 nm.

9. The method of claim 8, wherein the interface of the DBR with the mirror layer is substantially free of the fill material.

10. The method of claim 8, wherein polishing the upper surface of the mirror layer comprises chemical mechanical polishing characterized by a planarization length less than 5 mm.

11. The method of claim 10, wherein the chemical mechanical polishing uses a down force exceeding or about 0.1 PSI, a rotation rate exceeding or about 10 RPM, and a slurry flow rate exceeding or about 50 mL/min.

12. The method of claim 10, wherein the chemical mechanical polishing uses a slurry comprising cerium oxide particles suspended in a solvent comprising de-ionized water and an acid, the particles characterized by an average diameter less than 1000 nm.

13. The method of claim 12, wherein the chemical mechanical polishing uses an acid dissolved in the solvent.

14. A semiconductor structure comprising:
    a semiconductor substrate;
    a metal layer overlying the semiconductor substrate;
    a spacer layer overlying the metal layer;
    a mirror layer overlying the spacer layer;
    a fill material filling a contact hole formed in the mirror layer, the fill material substantially level with an upper surface of the mirror layer, the upper surface of the mirror layer characterized by an average roughness less than 5 nm; and
    an optical stack overlying the mirror layer and the fill material, wherein the optical stack comprises a distributed Bragg reflector (DBR) that forms an interface with the mirror layer and the fill material, and the DBR is characterized by a reflectance exceeding 95% across a wavelength range of 450 nm-650 nm.

15. The semiconductor structure of claim 14, wherein the DBR comprises a first layer characterized by a variation in a thickness of the first layer less than or about 30%.

16. The semiconductor structure of claim 14, wherein the interface is substantially free of the fill material.

17. The semiconductor structure of claim 14, wherein the contact hole extends to the metal layer, the fill material contacting the metal layer.

* * * * *